(12) United States Patent
Chuang et al.

(10) Patent No.: US 9,601,478 B2
(45) Date of Patent: Mar. 21, 2017

(54) OXIDE DEFINITION (OD) GRADIENT REDUCED SEMICONDUCTOR DEVICE

(71) Applicant: TAIWAN SEMICONDUCTOR MANUFACTURING COMPANY, LTD., Hsinchu (TW)

(72) Inventors: Yi-Lin Chuang, Taipei (TW); Chun-Cheng Ku, Zhubei (TW); Chin-Her Chien, Chung-Li (TW); Wei-Pin Changchien, Taichung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 15/045,504

(22) Filed: Feb. 17, 2016

(65) Prior Publication Data

US 2016/0163687 A1 Jun. 9, 2016

Related U.S. Application Data (62) Division of application No. 14/068,213, filed on Oct. 31, 2013, now Pat. No. 9,286,431.

(51) Int. Cl.
*H01L 29/06* (2006.01)
*H01L 27/02* (2006.01)
*G06F 17/50* (2006.01)

(52) U.S. Cl.
CPC ...... *H01L 27/0207* (2013.01); *G06F 17/5072* (2013.01); *G06F 17/5081* (2013.01); *H01L 29/0649* (2013.01)

(58) Field of Classification Search
CPC ............. G06F 17/5068; G06F 2217/12; G06F 17/5081; G06F 2217/80; G03F 1/144
USPC .................................. 716/111, 132, 118, 52
See application file for complete search history.

(56) References Cited

U.S. PATENT DOCUMENTS

2005/0251771 A1    11/2005  Robles
2012/0144361 A1*   6/2012   Cheng ................. G06F 17/5068
                                              716/132

* cited by examiner

*Primary Examiner* — David Vu
*Assistant Examiner* — Jonathan Han
(74) *Attorney, Agent, or Firm* — Hauptman Ham, LLP (57) ABSTRACT

An integrated circuit (IC) semiconductor device has a high oxide definition (OD) density region, a low OD density region adjacent to the high OD density region, and dummy cells in the high OD density region and the low OD density region to smooth a density gradient between the high OD density region and the low OD density region.

20 Claims, 8 Drawing Sheets

| 0.1 | 0.4 | 0.1 | 0.2 | 0.3 |
| --- | --- | --- | --- | --- |
| 0.2 | 0.4 | 0.4 | 0.3 | 0.2 |
| 0.3 | 0.3 | 0.2 | 0.2 | 0.1 |
| 0.1 | 0.1 | 0.2 | 0.1 | 0.3 |
| 0.2 | 0.2 | 0.4 | 0.3 | 0.4 |

Fig. 4A

| 0.25 | 0.36 | 0.20 | 0.21 | 0.28 |
| --- | --- | --- | --- | --- |
| 0.27 | 0.36 | 0.35 | 0.28 | 0.26 |
| 0.24 | 0.25 | 0.24 | 0.20 | 0.18 |
| 0.17 | 0.19 | 0.23 | 0.19 | 0.27 |
| 0.22 | 0.25 | 0.35 | 0.27 | 0.34 |

OXIDE DEFINITION (OD) GRADIENT REDUCED SEMICONDUCTOR DEVICE

PRIORITY CLAIM

The present application is a divisional of U.S. application Ser. No. 14/068,213, filed Oct. 31, 2013, which issued as U.S. Pat. No. 9,286,431 on Mar. 15, 2016, and which is incorporated herein by reference in its entirety.

BACKGROUND

The semiconductor device industry has produced a wide variety of digital devices at decreasing cost to address issues in a number of different areas. This has been achieved at least in part due to increasing integration density. The integration density of various integrated circuit components such as transistors, diodes, resistors and capacitors have benefited from continual reductions in minimum feature size into the deep submicron regime that in turn allows more components to be integrated into a given area. Computer added design/electronic design automation (CAD/EDA) tools facilitate highly integrated circuit designs including numerous oxide definition (OD) areas on each die. The OD areas correspond to active device areas and CAD/EDA tools define their arrangement.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

This description of the various embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

Semiconductor devices employing higher device integration density, such as finned field effect transistor (FinFET) semiconductor devices, include a billion transistors on a single semiconductor die in some instances. FinFET NMOS and PMOS transistors are formed in oxide definition (OD) areas. The OD area, sometimes labeled as an "oxide diffusion" area, defines an active area for each transistor, i.e., the area where the source, drain and channel under the gate of transistor are formed. The OD is defined to be between inactive areas, such as shallow trench isolation (STI) or field oxide (FOX) areas. An OD area contains PMOS or NMOS transistors. A discontinuity (gap) separates adjacent OD regions. Under certain circumstances, such discontinuities between the OD areas cause device performance degradation. In increasingly deep submicron feature size semiconductor devices, electrical characteristics of such devices are increasingly affected by variations in OD density. For example, compressive forces caused by shallow trench isolation (STI) in inactive areas associated with OD areas degrade NMOS transistor performance. Such performance degradation due to variations in OD density is even more significant if a high gradient in OD density exists on the die of a semiconductor device. While PMOS transistor performance improves under some compressive forces, predictability of PMOS drive current is also negatively affected by variations in OD density, especially in the presence of high gradient in OD density.

Figure 1:
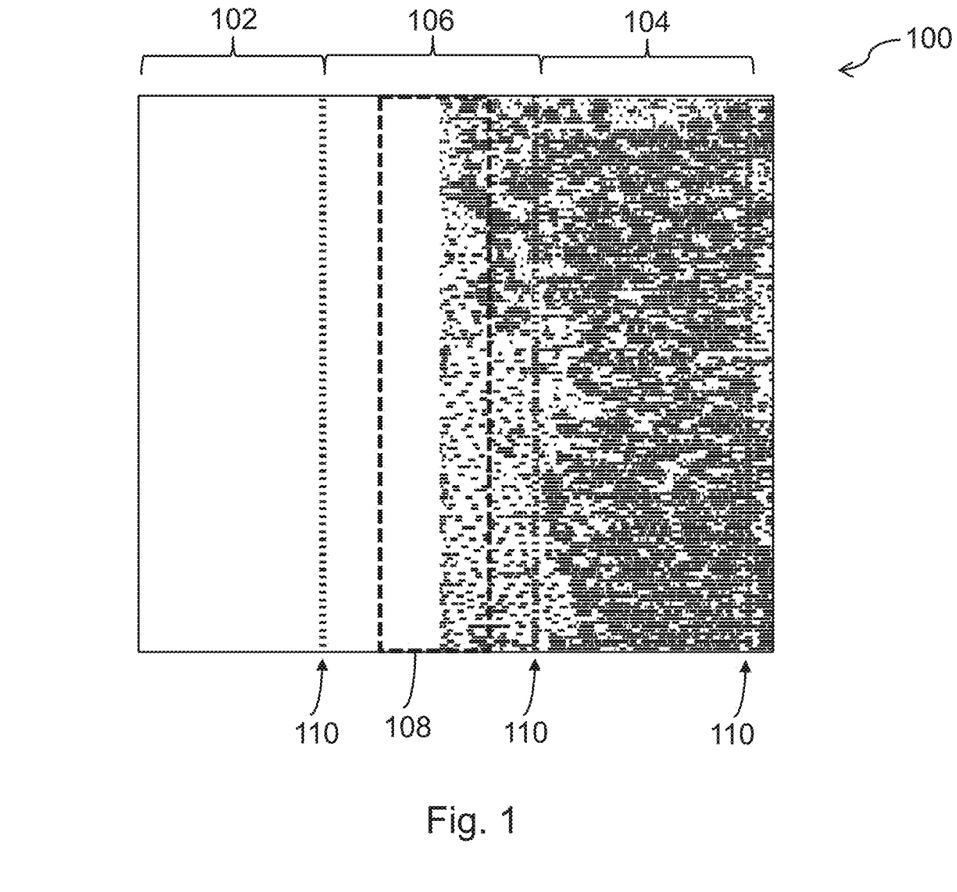
FIG. 1 is a top view of integrated circuit die of an OD density gradient reduced semiconductor device, prior to OD density gradient reducing, in accordance with one or more embodiments.

FIG. 1 is a top view of an integrated circuit die of an OD density gradient reduced semiconductor device 100, prior to OD density gradient reducing, in accordance with one or more embodiments. Device 100 comprises a low OD density area 104 having a low number of OD areas. Device 100 also comprises a high OD density area 102 having a high number of OD areas. Between the low OD density area 104 and high OD density area 102 is an intermediate OD density area 106. Although the intermediate OD density area 106 has an OD density higher than the low OD density area 104 and lower than the high OD density area 102, the intermediate OD density area contains a high OD density gradient area 108 having a highest OD density gradient. Dummy cells 110, i.e., cells containing OD but not electrically functionally a part of a larger circuit, are illustrated here for comparison purposes. In some circumstances, dummy cells 110 achieve a desired overall OD density; however, as illustrated in FIG. 1, the high OD density gradient area 108 still exists, exacerbating the issues described above.

Figure 2A:
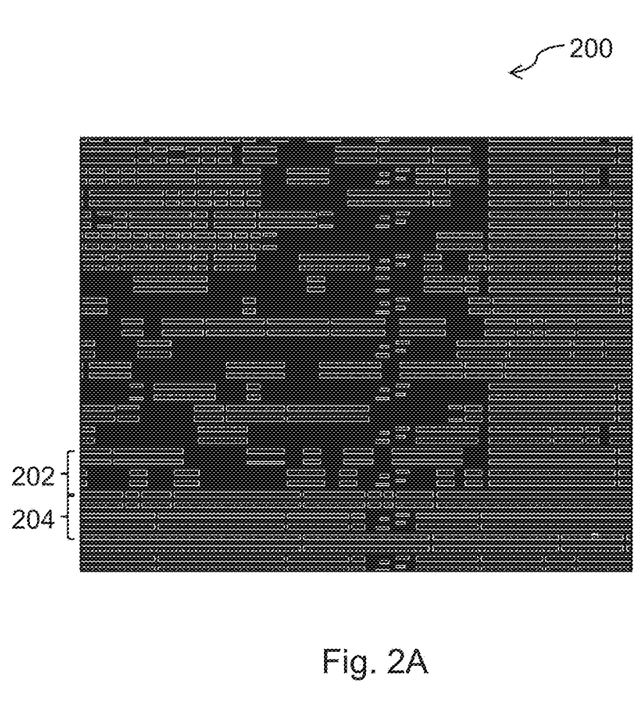
FIG. 2A is a top view of integrated circuit die of an OD density gradient reduced semiconductor device, prior to OD density gradient reducing, in accordance with one or more embodiments.

FIG. 2A is a top view of integrated circuit die of an OD density gradient reduced semiconductor device, prior to OD density gradient reducing, in accordance with one or more embodiments. Device 200 comprises a low OD density area 202 having a low number of OD areas in rows. Device 200 comprises a high OD density area 204 having a high number of OD areas in rows adjacent to the low OD density area 202. Together, the low OD density area 202 and adjacent high OD density area 204 form a high OD density gradient. Prior approaches to adjusting OD density did not successfully address issues associated with OD areas having a high OD density gradient such as that formed by low OD density area 202 and high OD density area 204.

Figure 2B:
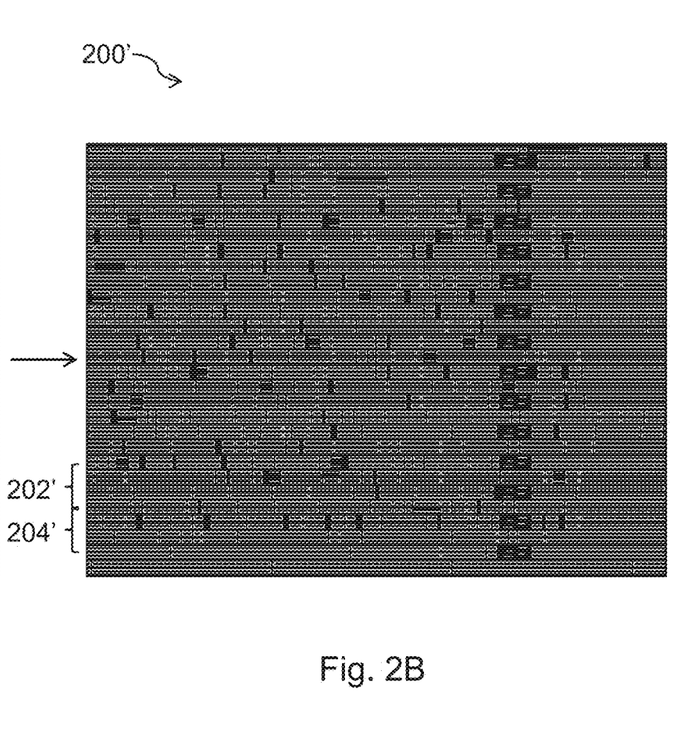
FIG. 2B is a top view of integrated circuit die of an OD density gradient reduced semiconductor device, after OD density gradient reducing, in accordance with one or more embodiments.

FIG. 2B is a top view of integrated circuit die of an OD density gradient reduced semiconductor device, after OD density gradient reducing, in accordance with one or more embodiments. OD area 202', corresponding to low OD density area 202 in FIG. 2A, further includes high OD density dummy cells that raise overall OD density. In some embodiments, the high OD density dummy cells are high OD density filler cells and decoupling (decap) cells.

OD area 204', corresponding to high OD density area 204 in FIG. 2A, further includes low OD density dummy cells or gaps that lower overall OD density. In some embodiments, the low OD density dummy cells are low OD density filler cells and boundary cells. Raising OD density in OD area 202', as compared to OD area 202, and lowering OD density in OD area 204', as compared to OD area 204, reduces the high OD density gradient. The OD density gradient between OD area 202' and OD area 204' was reduced by adding high OD density dummy cells having higher OD density than OD area 202 into OD area 202' and by adding low OD density dummy cells having lower OD density than OD area 204 into OD area 204'.

Figure 3:
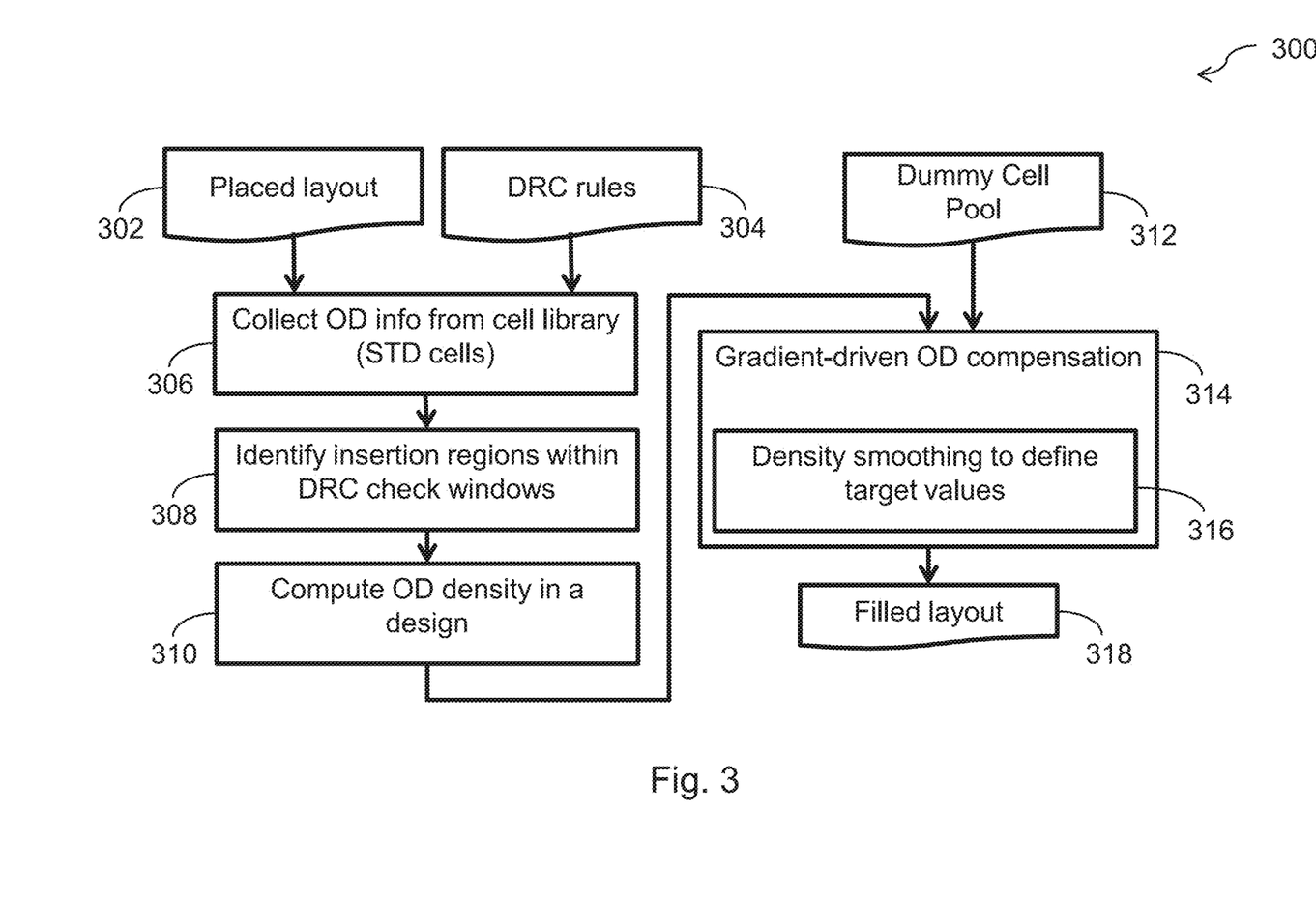
FIG. 3 is a block diagram for creating the integrated circuit die of the OD density gradient reduced semiconductor device of FIG. 2B, in accordance with one or more embodiments.

FIG. 3 is a flow chart of a method 300 of reducing OD density gradient in an integrated circuit semiconductor device, in accordance with one or more embodiments. It is understood that additional processes are not precluded from being performed before, during, and/or after the method 300 depicted in FIG. 3.

In operation 302, a computer, described below, executes instructions to receive a placed layout in electronic form for an integrated circuit semiconductor device. In some embodiments, the computer captures the placed layout from user input. In some embodiments, the computer automatically generates the placed layout. FIG. 2A is a top view of integrated circuit die of an OD density gradient reduced semiconductor device, prior to OD density gradient reducing, following operation 302, in accordance with some embodiments. Returning to FIG. 3, the placed layout includes transistors and other electronic devices, some having OD area. In operation 304, a set of design rule checking (DRC) rules are associated with the placed layout by the computer executing instructions in operation 302. The DRC rules include rules about feature sizes, feature spacing and other rules pertinent to cells used the placed layout.

In operation 306, OD information about cells specified in the placed layout and DRC rules is collected by the computer executing instructions from a corresponding cell library. In some embodiments, the cell library includes information about standard (STD) cells in the placed layout. A percentage of OD by cell is associated with cells identified in the placed layout from operation 302.

In operation 308, the computer executing instructions identifies insertion regions within DRC check windows where dummy cells are to be inserted. In some embodiments, the DRC check windows are 25 micrometer by 25 micrometer overlapped areas forming a grid covering the integrated circuit die. In operation 310, the computer executing instructions computes OD density in the insertion regions for the placed layout design from operation 302. In step 312, the computer stores and enables access to a library (pool) of dummy cells of different OD density percentages.

In operation 314, the computer executing instructions combines the OD density from operation 310 and the dummy cell pool from operation 312 to perform a gradient-driven OD smoothing compensation for reducing OD density gradient. In operation 316, an algorithm for smoothing OD density gradient defines target OD density values by the computer executing instructions. In operation 318, the OD density gradient from the placed layout in operation 302 is reduced by adding dummy cells to match a DRC check window's target OD density value by the computer executing instructions. FIG. 2B is a top view of integrated circuit die of an OD density gradient reduced semiconductor device, after OD density gradient reducing, following operation 318, in accordance with some embodiments.

Figure 4A:
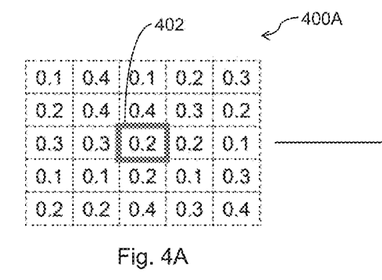
FIG. 4A is an OD density value array prior to OD density gradient reducing, in accordance with one or more embodiments.

FIG. 4A is an OD density value array 400A prior to OD density gradient reducing, in accordance with one or more embodiments. The OD density value array 400A is a 5 by 5 tile array of OD density percentage values. OD density percentage values within the array 400A vary from a minimum value of 0.1 to a maximum value of 0.4, with a range of 0.3. A selected middle OD density value 402 in the middle of the array 400A is highlighted for comparison purposes to illustrate OD density gradient reducing by smoothing of the values in the array. The middle OD density value 402 has a value of 0.2 and has neighboring values ranging from +0.2 to −0.1 different that the middle OD density value.

Figure 4B:
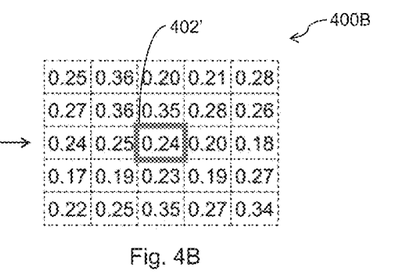
FIG. 4B is an OD density value array after OD density gradient reducing, in accordance with one or more embodiments.

FIG. 4B is an OD density value array 400B after OD density gradient reducing, in accordance with one or more embodiments. The OD density value array 400B is a 5 by 5 tile array of OD density percentage values after OD density gradient smoothing, corresponding to the OD density value array 400A in FIG. 4A. OD density percentage values within the array 400B vary from a minimum value of 0.17 to a maximum value of 0.36, with a range of 0.19. The minimum value has been increased, the maximum value decreased and the range decreased in array 400B as compared to array 400A. A middle OD density value 402' has a value of 0.24 and has neighboring values ranging from +0.12 to −0.05 different. The differences between the middle OD density value 402' and neighboring values is decreased as compared to the middle OD density value 402 in FIG. 4A. Reduction of range and difference of values between neighboring OD density values reduces OD density gradient.

As illustrated in FIG. 4B, a known negative exponential algorithm with a Gaussian weighting kernel is used to reduce OD density gradient by three dimensional (3D) smoothing. In some embodiments, a known Loess algorithm with a Tricube weighting kernel is used to reduce OD density gradient by 3D smoothing. In some embodiments, a known Running Average algorithm with a Uniform weighting kernel is used to reduce OD density gradient by 3D smoothing. In some embodiments, a known Running Median algorithm with a Uniform weighting kernel is used to reduce OD density gradient by 3D smoothing. In some embodiments, a known Bisquare algorithm with a Biweight weighting kernel is used to reduce OD density gradient by 3D smoothing. In some embodiments, a known Inverse Square algorithm with a Cauchy weighting kernel is used to reduce OD density gradient by 3D smoothing. In some embodiments, a known Inverse Distance algorithm with an Inverse Distance weighting kernel is used to reduce OD density gradient by 3D smoothing.

Figure 4C:
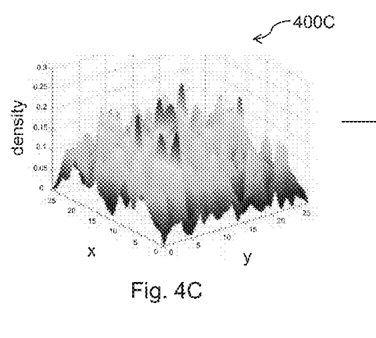
FIG. 4C is a three dimensional (3D) graphical representation of an OD density value array prior to OD density gradient reducing, in accordance with one or more embodiments.

FIG. 4C is a three dimensional (3D) graphical representation of an OD density value array 400C prior to OD density gradient reducing, in accordance with one or more embodiments. The OD density value array 400C is a >25 by >25 tile array of OD density percentage values. OD density percentage values within the array 400C vary from a minimum value of about 0 to a maximum value of about 0.20, with a range of 0.20.

Figure 4D:
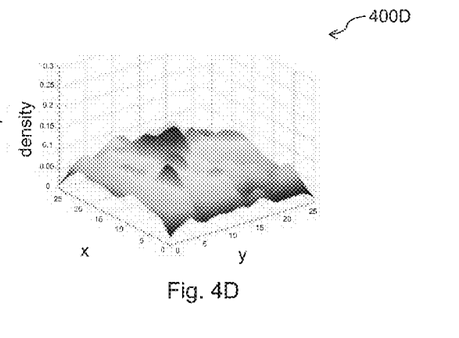
FIG. 4D is a three dimensional (3D) graphical representation of an OD density value array after OD density gradient reducing, in accordance with one or more embodiments.

FIG. 4D is a three dimensional (3D) graphical representation of an OD density value array 400D after OD density gradient reducing, in accordance with one or more embodiments. The OD density value array 400D is a >25 by >25 tile array of OD density percentage values corresponding to the OD density value array 400C in FIG. 4C. OD density percentage values within the array 400D vary from a minimum value of about 0.02 to a maximum value of about 0.12, with a range of 0.10. The minimum value has been increased, the maximum value decreased and the range decreased in array 400D as compared to array 400C in FIG. 4C. Reduction of range and difference of values between neighboring OD density values reduces OD density gradient. As illustrated in FIG. 4D, 3D smoothing is performed by the one of the methods described above to reduce OD density gradient in FIG. 4B.

Figure 5A:
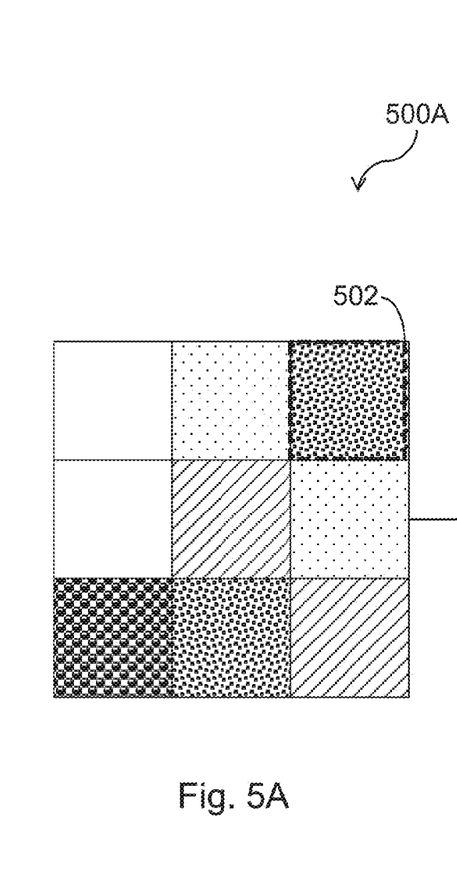
FIG. 5A is an OD density value array prior to OD density gradient reducing, in accordance with one or more embodiments.

FIG. 5A is an OD density value array 500A prior to OD density gradient reducing, in accordance with one or more embodiments. The OD density value array 500A is a 3 by 3 tile array of OD density percentage values represented graphically by 9 tiles, with higher OD density and lower OD density illustrated graphically by shading. OD density values of each tile in the OD density value array 500A are adjusted to reduce OD density gradient by 3D smoothing. For comparison purposes, a top right tile 502 is selected prior to 3D smoothing. The OD density value array 500A is 3D smoothed in a first pass to a reduced OD density gradient (not shown).

Figure 5B:
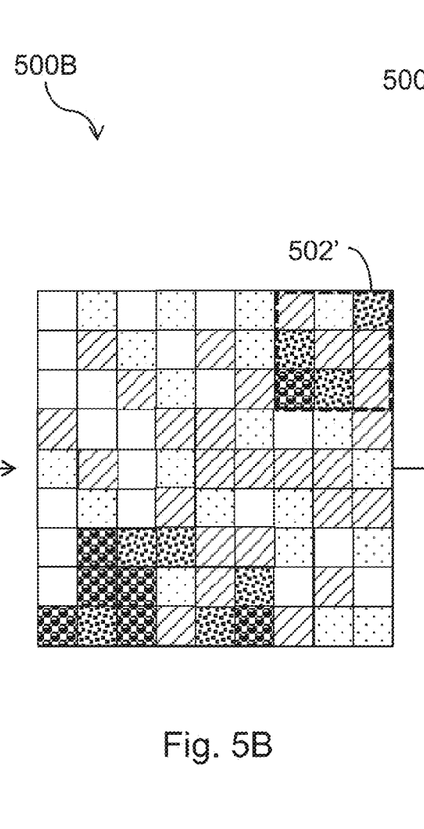
FIG. 5B is an OD density value array after a second pass of OD density gradient reducing, in accordance with one or more embodiments.

FIG. 5B is an OD density value array 500B after a first pass of OD density gradient reducing, in accordance with one or more embodiments. Each of the 9 tiles in the OD density value array 500A in FIG. 5A is divided into a 3 by 3 tile array as shown in FIG. 5B. For comparison purposes, the top right tile 502 in FIG. 5A is divided into a top right 3 by 3 tile array 502'. Correspondingly, the OD density value array 500B is a 9 by 9 tile array of OD density percentage values represented graphically by 81 tiles, with higher OD density and lower OD density represented by different shading. OD density values of each tile in the OD density value array 500B are adjusted to reduce OD density gradient by 3D smoothing.

Figure 5C:
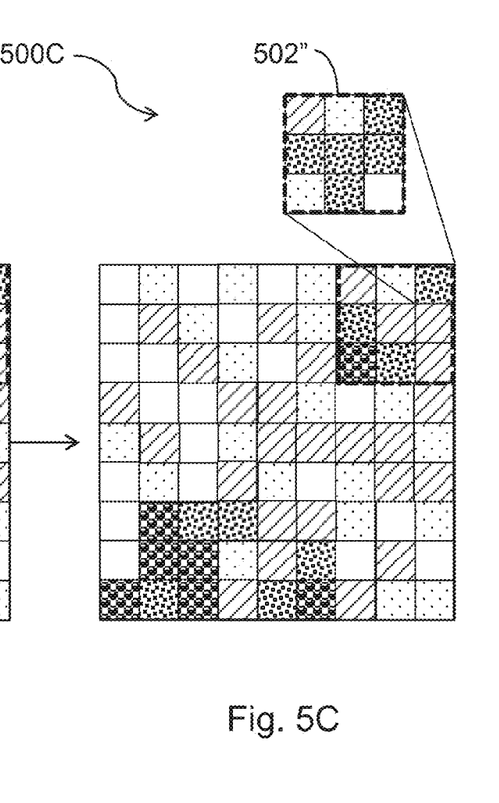
FIG. 5C is an OD density value array after a third pass of OD density gradient reducing, in accordance with one or more embodiments.

FIG. 5C is an OD density value array 500C after a third pass of OD density gradient reducing, in accordance with one or more embodiments. Each of the 81 tiles in the OD density value array 500B in FIG. 5B is divided into a 3 by 3 tile array. For comparison purposes, the a top right tile in 3 by 3 tile array 502' in FIG. 5B is further divided into 3 by 3 tile array 502" and 3D smoothed to reduce OD density gradient. After further dividing, the OD density value array 500C becomes a 27 by 27 tile array of OD density percentage values represented graphically by 729 tiles, with higher OD density and lower OD density represented by different shading. OD density values of each tile in the OD density value array 500C are adjusted to reduce OD density gradient by 3D smoothing, as shown in the 3 by 3 tile array 502". At each pass, the array of OD density values 500A, 500B, 500C is further divided into more tiles and 3D smoothed to reduce OD density gradient. Further dividing into more tiles and 3D smoothing at each pass results in an improved OD density gradient and a reduced possibility of DRC failure. As illustrated in FIGS. 5A, 5B and 5C, 3D smoothing is performed by the one of the methods described above to reduce OD density gradient in FIG. 4B.

Figure 6A:
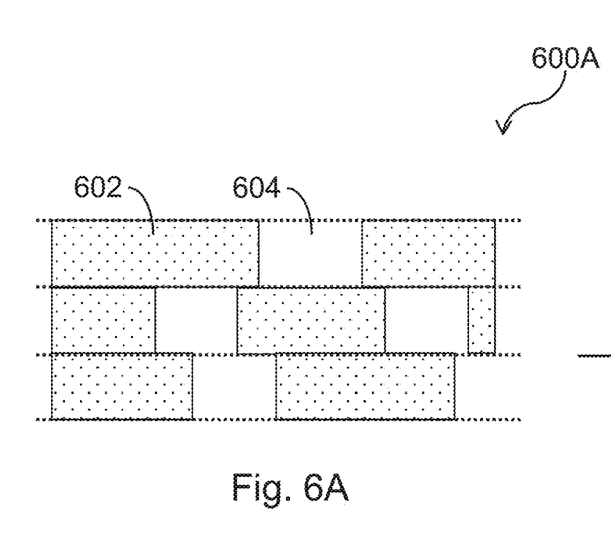
FIG. 6A is an OD density value array prior to OD density gradient reducing, in accordance with one or more embodiments.

FIG. 6A is an OD density value array 600A prior to OD density gradient reducing, in accordance with one or more embodiments. Similar to FIG. 2A, OD density value array 600 A is a placed layout with at least one electronic device having OD 602 and at least one gap 604.

Figure 6B:
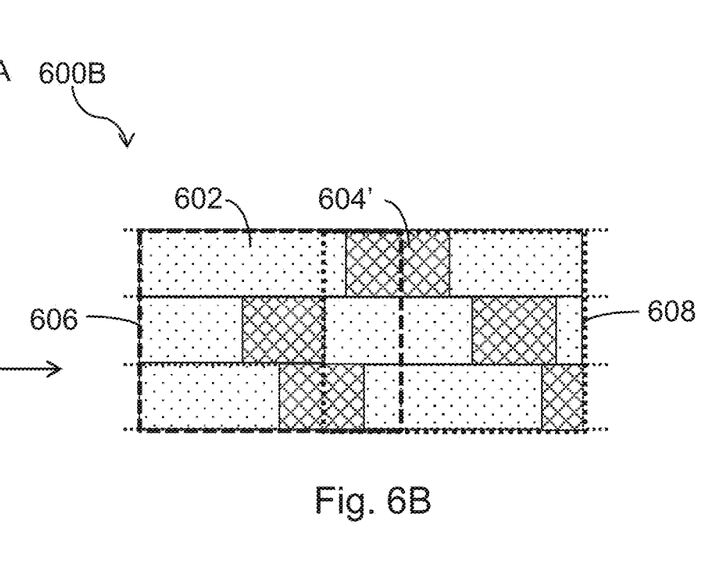
FIG. 6B is an OD density value array after OD density gradient reducing, in accordance with one or more embodiments.

FIG. 6B is an OD density value array 600B after OD density gradient reducing, in accordance with one or more embodiments. Similar to FIG. 2B, OD density value array 600B is a placed layout with the at least one electronic device having OD 602 and at least one dummy cell 604' in place of gap 604 in FIG. 6A. Unlike FIG. 2B, placement of at least one electronic device having OD 602 is not changed between FIG. 2A and FIG. 2B. However, the at least one gap 604 from FIG. 6A is filled with at least one dummy cell 604'. The at least one dummy cell 604' is selected to have an OD density similar to an average OD density in a DRC check window 606 and a DRC check window 608. DRC check window 606 and DRC check window 608 overlap. The at least one dummy cell 604' is selected from a library (pool) of dummy cells of different OD percentages to perform a 3D smoothing by the one of the methods described above to reduce OD density gradient in FIG. 4B.

Figure 7A:
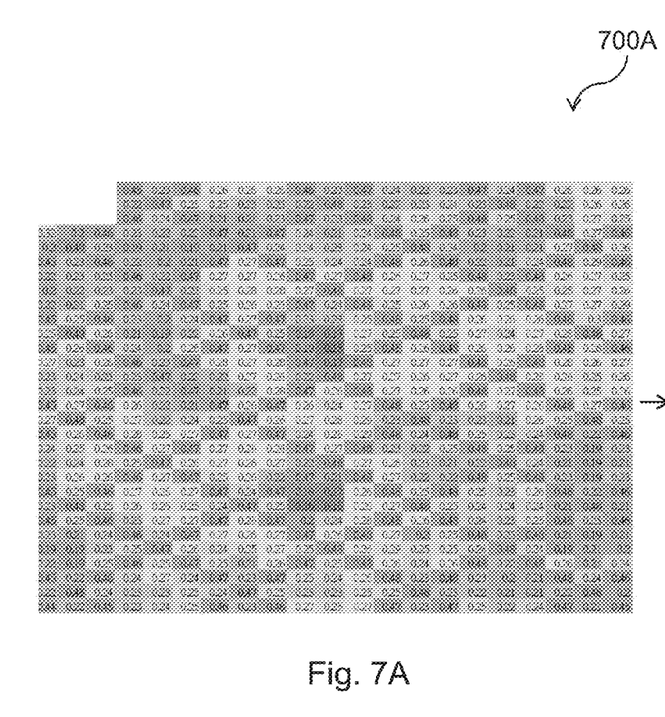
FIG. 7A is an OD density value array prior to OD density gradient reducing, in accordance with one or more embodiments.

FIG. 7A is an OD density value array 700A prior to OD density gradient reducing, in accordance with one or more embodiments. Similar to OD density value array 400A in FIG. 4A, OD density value array 700A is a 21 by 30 tile array of OD density percentage values, missing 9 tiles in the upper left. OD density percentage values within the array 400A vary from a minimum value of 0.15 to a maximum value of 0.49, with a range of 0.34.

Figure 7B:
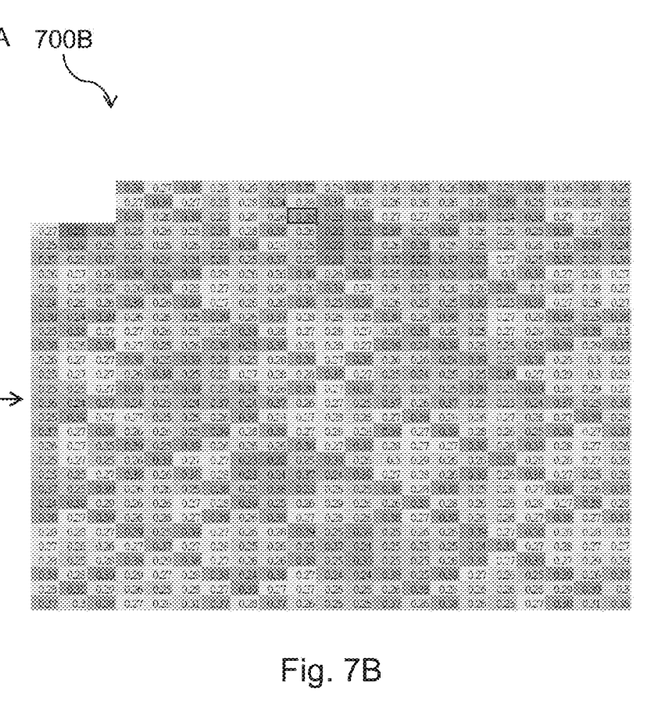
FIG. 7B is an OD density value array after OD density gradient reducing, in accordance with one or more embodiments.

FIG. 7B is an OD density value array 700B after OD density gradient reducing, in accordance with one or more embodiments. Similar to OD density value array 400B in FIG. 4B, OD density value array 700B is a 21 by 30 tile array of OD density percentage values, missing 9 tiles in the upper left. OD density percentage values within the array 400A vary from a minimum value of 0.21 to a maximum value of 0.39, with a range of 0.18. The range of OD density values in array 700A of 0.34 was reduced to 0.18 in array 700B illustrating a reduction in OD density gradient. As illustrated in FIGS. 7A and 7B, 3D smoothing is performed by the one of the methods described above to reduce OD density gradient in FIG. 4B.

Figure 8:
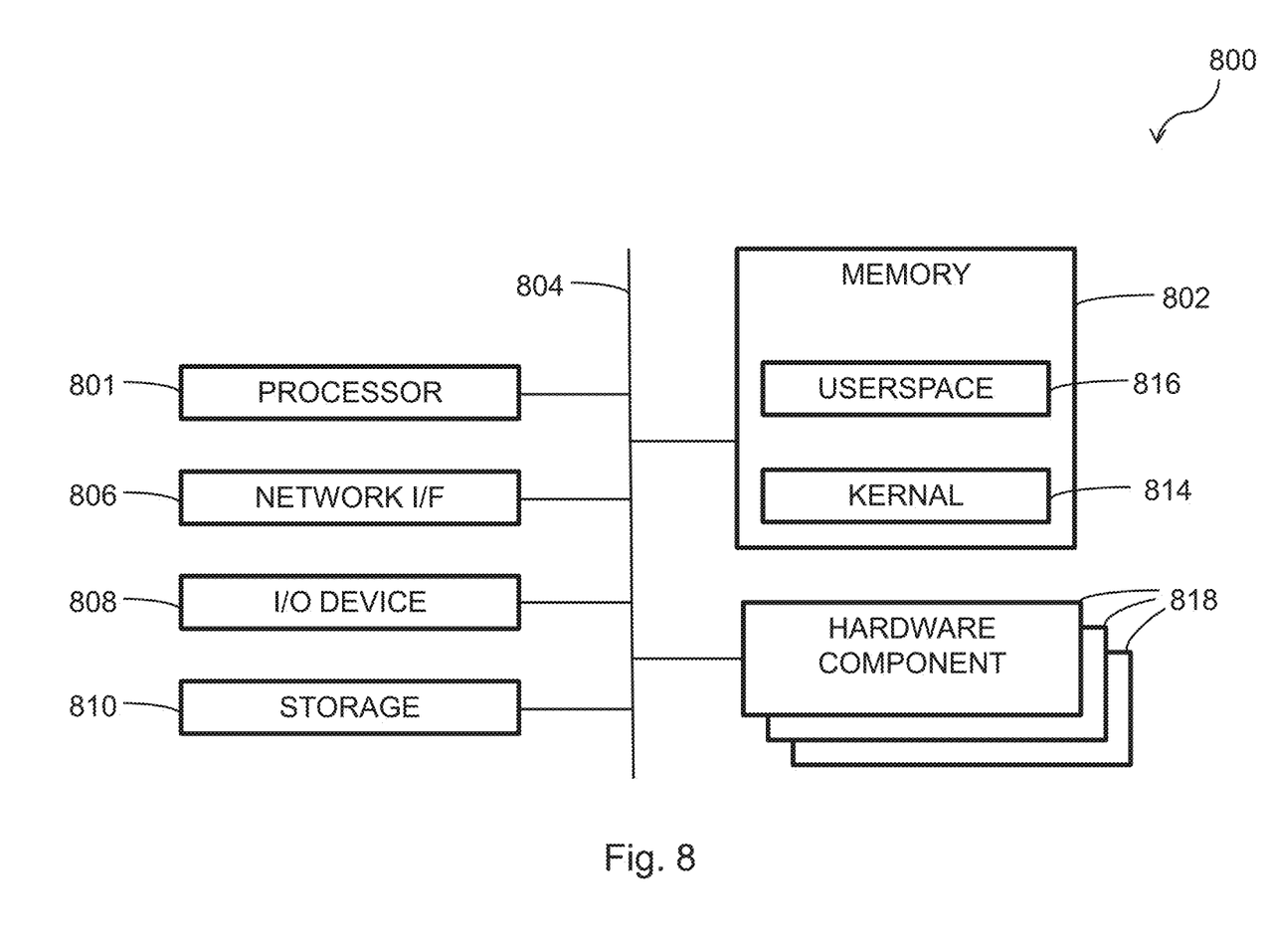
FIG. 8 is a block diagram of a computer system 800, in accordance with some embodiments.

FIG. 8 is a block diagram of a computer system 800, in accordance with some embodiments. The computer system 800 comprises a processor 801, a memory 802, a network interface (I/F) 806, a storage 810, an input/output (I/O) device 808, and one or more hardware components 818 communicatively coupled via a bus 804 or other interconnection communication mechanism.

The memory 802 comprises, in some embodiments, a random access memory (RAM) and/or other dynamic storage device and/or read only memory (ROM) and/or other static storage device, coupled to the bus 804 for storing data and/or instructions to be executed by the processor 801, e.g., kernel 814, userspace 816, portions of the kernel and/or the userspace, and components thereof. The memory 802 is also used, in some embodiments, for storing temporary variables or other intermediate information during execution of instructions to be executed by the processor 801.

In some embodiments, a storage device 810, such as a magnetic disk or optical disk, is coupled to the bus 804 for storing data and/or instructions, e.g., kernel 814, userspace 816, etc. The I/O device 808 comprises an input device, an output device and/or a combined input/output device for enabling user interaction with the system 800. An input device comprises, for example, a keyboard, keypad, mouse, trackball, trackpad, and/or cursor direction keys for communicating information and commands to the processor 801. An output device comprises, for example, a display, a printer, a voice synthesizer, etc. for communicating information to a user.

In some embodiments, one or more of the processes or functionality described herein are realized by a processor, e.g., the processor 801, which is programmed for performing such processes. One or more of the memory 802, the I/F 806, the storage 810, the I/O device 808, the hardware components 818, and the bus 804 is/are operable to receive instructions, data, and/or other parameters for processing by the processor 801. In some embodiments, one or more of the processes or functionality is/are performed by specifically configured hardware (e.g., by one or more application specific integrated circuits or ASIC(s)) which is/are included) separate from, or in lieu of, the processor. Some embodiments incorporate more than one of the described processes in a single ASIC.

One aspect of this description relates to an integrated circuit (IC) semiconductor device. The IC semiconductor device includes a high OD density region, a low OD density region adjacent to the high OD density region, and dummy cells in the high OD density region and the low OD density region to smooth a density gradient between the high OD density region and the low OD density region.

Another aspect of this description relates to an IC semiconductor device. The IC semiconductor device includes a first OD density region and a second OD density region adjacent to the first OD density region. An active area density of the first OD density region is greater than an active area density of the second density region. The IC semiconductor device further includes dummy cells in the at least the first OD density region or the second OD density region. An OD density gradient between the first OD region and the second OD region is smoother than an OD density gradient between the active area density of the first OD region and the active area density of the second OD region.

Still another aspect of this description relates to an IC semiconductor device. The IC semiconductor device includes a high OD density region, a low oxide definition density region, and dummy cells in the high OD density region and the low OD density region. The dummy cells are added corresponding to 3D smoothing to reduce an OD density gradient.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) semiconductor device, comprising:
    a high oxide definition (OD) density region having a first OD density;
    a low OD density region adjacent to the high OD density region, the low OD density region having a second OD density;
    an intermediate OD density region between the high OD density region and the low OD density region, the intermediate OD density region having a third OD density; and
    a first set of dummy cells in the intermediate OD density region, the first set of dummy cells forming an OD density gradient between the high OD density region and the low OD density region.

2. The IC semiconductor device of claim 1, wherein
    the high OD density region comprises a first sub-region and a second sub-region, an OD density of the first sub-region is greater than an OD density of the second sub-region;
    the low OD density region comprises a third sub-region and a fourth sub-region, an OD density of the third sub-region is greater than an OD density of the fourth sub-region; and
    the dummy cells comprise a first set of dummy cells in the high OD density region and a second set of dummy cells in the low OD density region.

3. The IC semiconductor device of claim 2, wherein
    each of the first sub-region, the second sub-region, the third sub-region, and the fourth sub-region comprises at least one active device.

4. The IC semiconductor device of claim 2, wherein the second sub-region includes the first set of dummy cells.

5. The IC semiconductor device of claim 2, wherein the third sub-region includes the second set of dummy cells.

6. The IC semiconductor device of claim 1, wherein the dummy cells are selected from filler cells, decoupling (decap) cells, or boundary cells.

7. The IC semiconductor device of claim 1, wherein
- the high OD density region comprises a first sub-region and a second sub-region, an OD density of the first sub-region being greater than an OD density of the second sub-region;
- the low OD density region comprises a third sub-region and a fourth sub-region, an OD density of the third sub-region being greater than an OD density of the fourth sub-region; and
- the dummy cells comprise a second set of dummy cells and a third set of dummy cells in the high OD density region and a fourth set of dummy cells and a fifth set of dummy cells in the low OD density region, wherein an OD density of the third set of dummy cells is greater than an OD density of the second set of dummy cells, and an OD density of the fifth set of dummy cells is greater than an OD density of the fourth set of dummy cells.

8. The IC semiconductor device of claim 7, wherein the first sub-region includes the second set of dummy cells and the second sub-region includes the third set of dummy cells and the third sub-region includes the fourth set of dummy cells and the fourth sub-region includes the fifth set of dummy cells.

9. An integrated circuit (IC) semiconductor device, comprising:
- a first region having a first oxide definition OD density;
- a second region having a second OD density and adjacent to the first region, wherein an active area density of the first region is greater than an active area density of the second region;
- a third region having a third OD density and comprising a portion of the first region and a portion of the second region; and
- dummy cells in the third region, wherein an OD density gradient within the third region is smoother than an active area density gradient across the third region, from the first region to the second region, wherein the OD density gradient decreases from the first region toward the second region.

10. The IC semiconductor device of claim 9, wherein the dummy cells are selected from filler cells, decoupling (decap) cells, or boundary cells.

11. The IC semiconductor device of claim 9, further comprising:
- at least one insertion region in the first region or the second region.

12. The IC semiconductor device of claim 11, wherein the dummy cells comprise at least one high OD density dummy cell and at least one low OD density dummy cell, and the at least one insertion region includes the at least one high OD density dummy cell or the at least one low OD density dummy cell.

13. The IC semiconductor device of claim 11, wherein
- the at least one insertion region comprises at least one high OD density sub-region and at least one low OD density sub-region; and
- the dummy cells comprise at least one high OD density dummy cell filled in the low OD density sub-region and a low OD density dummy cell filled in the high OD density sub-region.

14. The IC semiconductor device of claim 13, wherein the at least one high OD density sub-region or the at least one low OD density sub-region is dividable into a plurality of tiles.

15. The IC semiconductor device of claim 14, wherein the at least one high OD density dummy cell or the at least one low OD density dummy cell is filled in the at least one tiles of the plurality of tiles.

16. An integrated circuit (IC) semiconductor device, comprising:
- a high oxide definition (OD) density region having a first OD density;
- a low (OD) density region having a second OD density;
- an intermediate OD density region between the high OD density region and the low OD density region having dummy cells and active areas, wherein
- the active areas have a first OD density gradient, and
- the dummy cells and the active areas in the intermediate OD density region define a second OD density gradient that follows a three dimensional (3D) smoothing pattern, the second OD density gradient being smoother than the first OD density gradient.

17. The IC semiconductor device of claim 16, wherein the dummy cells in the low OD density region have an OD density higher than the low OD density region.

18. The IC semiconductor device of claim 17, wherein the dummy cells in the low OD density region are selected from filler cells or decoupling (decap) cells.

19. The IC semiconductor device of claim 16, wherein the dummy cells in the high OD density region have an OD density lower than the high OD density region.

20. The IC semiconductor device of claim 19, wherein the dummy cells in the high OD density region are selected from filler cells or border cells.

* * * * *